US012635250B2

(12) United States Patent
Kim et al.

(10) Patent No.: US 12,635,250 B2
(45) Date of Patent: May 19, 2026

(54) THIN FILM TRANSISTOR ARRAY SUBSTRATE AND DISPLAY DEVICE

(71) Applicants: LG Display Co., Ltd., Seoul (KR); IUCF-HYU (INDUSTRY-UNIVERSITY COOPERATION FOUNDATION HANYANG UNIVERSITY), Seoul (KR)

(72) Inventors: Harkjin Kim, Incheon (KR); Kwanghwan Ji, Incheon (KR); Jae Kyeong Jeong, Seoul (KR); Do Hyun Kim, Seoul (KR); Dong Young Kim, Paju-si (KR); Jeongeun Oh, Seoul (KR)

(73) Assignees: LG Display Co., Ltd., Seoul (KR); IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 383 days.

(21) Appl. No.: 18/324,103

(22) Filed: May 25, 2023

(65) Prior Publication Data

US 2023/0387138 A1 Nov. 30, 2023

(30) Foreign Application Priority Data

May 30, 2022 (KR) ........................ 10-2022-0066072

(51) Int. Cl.
| | |
|---|---|
| *H01L 27/12* | (2006.01) |
| *H10D 86/40* | (2025.01) |
| *H10D 86/60* | (2025.01) |

(52) U.S. Cl.
CPC ........... *H10D 86/60* (2025.01); *H10D 86/423* (2025.01)

(58) Field of Classification Search
CPC ...... H10D 86/60; H10D 86/423; H10D 86/40; H10D 86/411; H10D 86/451; H10D 30/6757; H10D 30/6708; H10D 30/67; H10D 30/6758; H10K 59/1213; H10K 59/121; H10K 59/122; H10K 77/111;
(Continued)

(56) References Cited

U.S. PATENT DOCUMENTS

| | | | | |
|---|---|---|---|---|
| 2020/0303428 A1* | 9/2020 | Liu | ...................... | H10D 86/423 |
| 2021/0335846 A1 | 10/2021 | Lu et al. | | |
| 2022/0328532 A1* | 10/2022 | Ozeki | .................. | H10D 86/443 |

FOREIGN PATENT DOCUMENTS

| | | |
|---|---|---|
| KR | 20110021081 A | 3/2011 |
| KR | 20170050229 A | 5/2017 |

* cited by examiner

*Primary Examiner* — Nikolay K Yushin
(74) *Attorney, Agent, or Firm* — Seed Intellectual Property Law Group LLP

(57) ABSTRACT

Embodiments of the present disclosure relate to a thin film transistor array substrate and a display device. Since a wavy structure is formed through heat treatment in a structure in which a first buffer layer made of an organic material, a second buffer layer made of a metal oxide and a third buffer layer made of an inorganic material are stacked, it is possible to provide a display device including an array substrate which has stretchable characteristics through the wavy structure while preventing a crack from occurring in the third buffer layer and preventing characteristics of thin film transistors disposed on the third buffer layer from degrading.

19 Claims, 8 Drawing Sheets

(58) Field of Classification Search
CPC ...... H10K 77/10; H10K 77/00; H10H 29/142;
H10H 29/14; H10H 29/03
See application file for complete search history.

<EX 1>

<EX 2>

THIN FILM TRANSISTOR ARRAY SUBSTRATE AND DISPLAY DEVICE

CROSS-REFERENCE TO RELATED APPLICATION

This application claims priority from Korean Patent Application No. 10-2022-0066072, filed on May 30, 2022, which is hereby incorporated by reference for all purposes as if fully set forth herein.

BACKGROUND

Technical Field

Embodiments of the present disclosure relate to a thin film transistor array substrate and a display device.

Description of the Related Art

Display devices may be classified into various types of display devices, such as a liquid crystal display device, a quantum dot display device and an organic light emitting display device, depending on a scheme in which a display panel displays an image.

Also, display devices may be classified according to their shapes. For example, a display device may have a flat or curved shape, and as the case may be, may have a structure in which the shape of the display device may be changed, such as in a foldable display device, a rollable display device and a stretchable display device.

BRIEF SUMMARY

Embodiments of the present disclosure may provide measures capable of easily implementing various types of display devices while maintaining performance of thin film transistors included in the display devices.

In order to provide a display function while the shape of a display device is changed, it is beneficial for the display panel thereof to have flexible characteristics.

Embodiments of the present disclosure may provide a display device including: a substrate; a first buffer layer disposed on the substrate, and having a vertical distance between a first point on a top surface thereof and the substrate being a first distance and a vertical distance between a second point on the top surface thereof and the substrate being a second distance smaller than the first distance; a second buffer layer disposed on the first buffer layer, and including a metal oxide; a third buffer layer disposed on the second buffer layer; and a plurality of thin film transistors disposed on the third buffer layer.

Embodiments of the present disclosure may provide a display device including: a substrate; a first buffer layer disposed on the substrate, and having a flat bottom surface and a curved top surface; a second buffer layer disposed on the first buffer layer, disposed along a shape of the top surface of the first buffer layer, and including a metal oxide; a third buffer layer disposed on the second buffer layer, and disposed along a shape of a top surface of the second buffer layer; and a plurality of thin film transistors disposed on the third buffer layer, and each including a semiconductor layer, a gate electrode, a source electrode and a drain electrode, at least one of the semiconductor layer, the gate electrode, the source electrode and the drain electrode being curved along a shape of a top surface of the third buffer layer.

Embodiments of the present disclosure may provide a thin film transistor array substrate including: a substrate; a first buffer layer disposed on the substrate, and having a vertical distance between a first point on a top surface thereof and the substrate being a first distance and a vertical distance between a second point on the top surface thereof and the substrate being a second distance smaller than the first distance; a second buffer layer disposed on the first buffer layer, and including a metal oxide; a third buffer layer disposed on the second buffer layer, and thicker than the second buffer layer; and a plurality of thin film transistors disposed on the third buffer layer.

According to the embodiments of the present disclosure, it is possible to easily implement a display device capable of changing a shape, such as a foldable, rollable or stretchable display device, while maintaining performance of elements included in the display device.

DESCRIPTION OF THE SEVERAL VIEWS OF THE DRAWINGS

The above and other benefits, features, and advantages of the present disclosure will be more clearly understood from the following detailed description, taken in conjunction with the accompanying drawings, in which.

DETAILED DESCRIPTION

Figure 1:
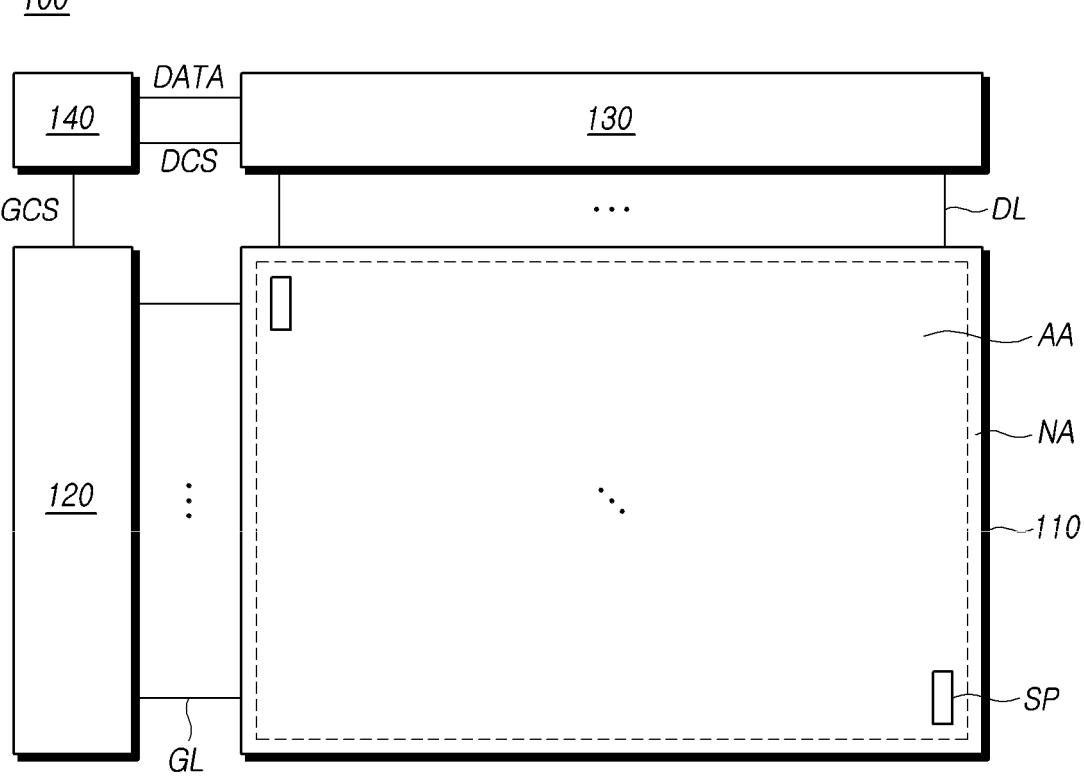
FIG. 1 is a diagram schematically illustrating the configuration of a display device in accordance with embodiments of the present disclosure.

In the following description of examples or embodiments of the present disclosure, reference will be made to the accompanying drawings in which specific examples or embodiments that can be implemented is shown by way of illustration, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear.

The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to accompanying drawings.

FIG. 1 is a diagram schematically illustrating the configuration of a display device 100 in accordance with embodiments of the present disclosure.

Referring to FIG. 1, the display device 100 may include a display panel 110, and a gate driver circuit 120, a data driver circuit 130 and a controller 140 for driving the display panel 110.

The display panel 110 may include an active area AA in which a plurality of subpixels SP are disposed and a non-active area NA which is located outside the active area AA.

In the display panel 110, a plurality of gate lines GL and a plurality of data lines DL may be disposed, and the subpixels SP may be located at areas where the gate lines GL and the data lines DL overlap with each other.

The gate driver circuit 120 may be controlled by the controller 140, and may sequentially output a scan signal to the plurality of gate lines GL disposed in the display panel 110 to control driving timings of the plurality of subpixels SP.

The gate driver circuit 120 may include at least one gate driver integrated circuit (GDIC), and may be located on one side or both sides of the display panel 110 depending on a driving scheme.

Each GDIC may be connected to a bonding pad of the display panel 110 by a tape automated bonding (TAB) method or a chip-on-glass (COG) method. Alternatively, each GDIC may be implemented as a gate-in-panel (GIP) type to be directly disposed in the display panel 110. Alternatively, each GDIC may be disposed in the display panel 110 by being integrated thereinto. Alternatively, each GDIC may be implemented in a chip-on-film (COF) method in which the GDIC is mounted on a film connected to the display panel 110.

The data driver circuit 130 receives image data DATA from the controller 140, and converts the image data DATA into a data voltage of an analog type. The data driver circuit 130 outputs the data voltage to each data line DL at a timing when the scan signal is applied through the gate line GL, to allow each subpixel SP to represent brightness according to the image data.

The data driver circuit 130 may include at least one source driver integrated circuit (SDIC).

Each SDIC may include a shift register, a latch circuit, a digital-to-analog converter, an output buffer, and so on.

Each SDIC may be connected to a bonding pad of the display panel 110 by a TAB method or a COG method. Alternatively, each SDIC may be directly disposed in the display panel 110. Alternatively, each SDIC may be disposed in the display panel 110 by being integrated thereinto. Alternatively, each SDIC may be implemented in a COF method. In this case, each SDIC may be mounted on a film connected to the display panel 110, and may be electrically connected to the display panel 110 through wirings on the film.

The controller 140 may supply various control signals to the gate driver circuit 120 and the data driver circuit 130, and may control operations of the gate driver circuit 120 and the data driver circuit 130.

The controller 140 may be mounted on a printed circuit board, a flexible printed circuit or the like, and may be electrically connected to the gate driver circuit 120 and the data driver circuit 130 through the printed circuit board, the flexible printed circuit or the like.

The controller 140 may cause the gate driver circuit 120 to output the scan signal at a timing set in each frame. The controller 140 may convert image data received from the outside into a data signal format used in the data driver circuit 130, and may output the converted image data to the data driver circuit 130.

The controller 140 receives various timing signals, including a vertical synchronization signal (VSYNC), a horizontal synchronization signal (HSYNC), an input data enable signal (DE), a clock signal (CLK) and so on, together with the image data from the outside (e.g., a host system).

The controller 140 may generate the various control signals using the various timing signals received from the outside, and may output the various control signals to the gate driver circuit 120 and the data driver circuit 130.

For example, in order to control the gate driver circuit 120, the controller 140 outputs various gate control signals GCS including a gate start pulse (GSP), a gate shift clock (GSC), a gate output enable signal (GOE) and so on.

The gate start pulse (GSP) controls the operation start timing of the at least one GDIC which constitutes the gate driver circuit 120. The gate shift clock (GSC), as a clock signal which is inputted in common to the at least one GDIC, controls the shift timing of the scan signal. The gate output enable signal (GOE) specifies the timing information of the at least one GDIC.

Further, in order to control the data driver circuit 130, the controller 140 outputs various data control signals DCS including a source start pulse (SSP), a source sampling clock (SSC), a source output enable signal (SOE) and so on.

The source start pulse (SSP) controls the data sampling start timing of the at least one SDIC which constitutes the data driver circuit 130. The source sampling clock (SSC) is a clock signal which controls a data sampling timing in each SDIC. The source output enable signal (SOE) controls the output timing of the data driver circuit 130.

The display device 100 may further include a power management integrated circuit which supplies various voltages or currents to the display panel 110, the gate driver circuit 120, the data driver circuit 130 and so on or controls various voltages or currents to be supplied.

Each subpixel SP may be an area which is positioned at a region of overlap of the gate line GL and the data line DL, and at least one circuit element including an element which emits light may be disposed in the subpixel SP.

For example, when the display device 100 is an organic light emitting display device, organic light emitting diodes (OLEDs) and various circuit elements may be disposed in the plurality of subpixels SP. By controlling currents supplied to the organic light emitting diodes (OLEDs) by the various circuit elements, each subpixel SP may represent brightness corresponding to image data.

Alternatively, as the case may be, a light emitting diode (LED) or a micro light emitting diode (ILED) may be disposed in the subpixel SP.

Figure 2:
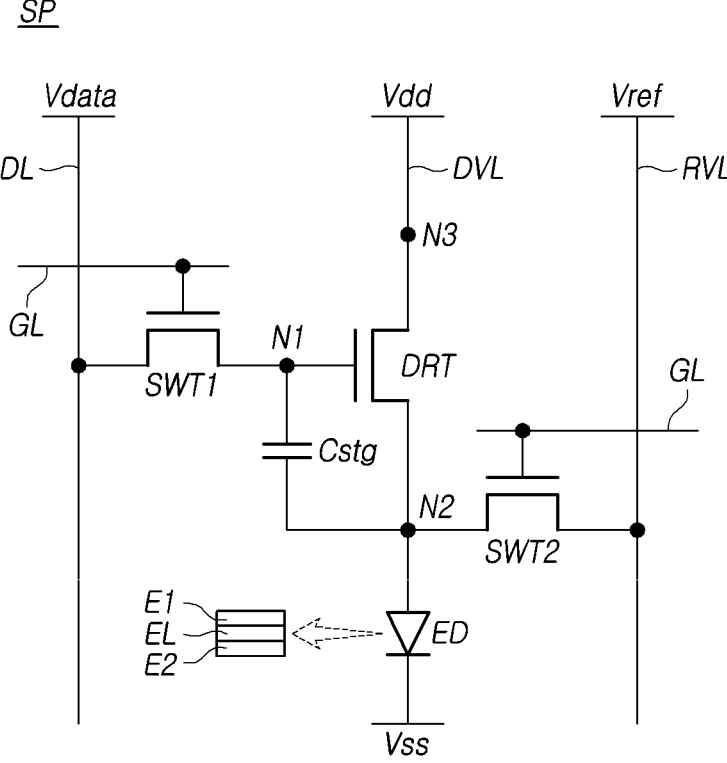
FIG. 2 is a diagram illustrating an example of the circuit structure of a subpixel included in a display device in accordance with embodiments of the present disclosure.

FIG. 2 is a diagram illustrating an example of the circuit structure of a subpixel SP included in a display device 100 in accordance with embodiments of the present disclosure.

Referring to FIG. 2, a light emitting element ED and a driving transistor DRT for driving the light emitting element ED may be disposed in the subpixel SP. At least one circuit element other than the light emitting element ED and the driving transistor DRT may be further disposed in the subpixel SP.

For example, as in an example illustrated in FIG. 2, a first switching transistor SWT1, a second switching transistor SWT2 and a storage capacitor Cstg may be further disposed in the subpixel SP.

The example illustrated in FIG. 2 shows, in addition to the light emitting element ED, a 3T1C structure in which three thin film transistors and one capacitor are disposed in the subpixel SP. However, embodiments of the present disclosure are not limited thereto. The example illustrated in FIG. 2 shows a case where all of the thin film transistors are an N type, but as the case may be, the thin film transistors disposed in the subpixel SP may be a P type.

Referring to FIG. 2, the first switching transistor SWT1 may be electrically connected between the data line DL and a first node N1. A data voltage Vdata may be supplied to the subpixel SP through the data line DL. The first node N1 may be a gate node of the driving transistor DRT.

The first switching transistor SWT1 may be controlled by the scan signal supplied to the gate line GL. The first switching transistor SWT1 may control that the data voltage Vdata supplied through the data line DL is applied to the gate node of the driving transistor DRT.

The driving transistor DRT may be electrically connected between a driving voltage line DVL and the light emitting element ED.

A second node N2 of the driving transistor DRT may be electrically connected to the light emitting element ED. The second node N2 may be a source node or a drain node of the driving transistor DRT.

A third node N3 of the driving transistor DRT may be electrically connected to the driving voltage line DVL. The third node N3 may be the drain node or the source node of the driving transistor DRT. A first driving voltage Vdd may be supplied to the third node N3 of the driving transistor DRT through the driving voltage line DVL. The first driving voltage Vdd may be a high potential driving voltage.

The driving transistor DRT may be controlled by a voltage applied to the first node N1. The driving transistor DRT may control a driving current to be supplied to the light emitting element ED.

The second switching transistor SWT2 may be electrically connected between a reference voltage line RVL and the second node N2. A reference voltage Vref may be supplied to the second node N2 through the reference voltage line RVL.

The second switching transistor SWT2 may be controlled by the scan signal supplied to the gate line GL. The gate line GL which controls the second switching transistor SWT2 may be the same as or different from the gate line GL which controls the first switching transistor SWT1.

The second switching transistor SWT2 may control that the reference voltage Vref is applied to the second node N2. As the case may be, the second switching transistor SWT2 may control that a voltage of the second node N2 is sensed through the reference voltage line RVL.

The storage capacitor Cstg may be electrically connected between the first node N1 and the second node N2. The storage capacitor Cstg may maintain the data voltage Vdata applied to the first node N1, for one frame.

The light emitting element ED may be electrically connected between the second node N2 and a line to which a second driving voltage Vss is supplied. The second driving voltage Vss may be a low potential driving voltage.

The light emitting element ED may include a first electrode layer E1, a light emitting layer EL and a second electrode layer E2. The first electrode layer E1 may be electrically connected to the driving transistor DRT. The second electrode layer E2 may be electrically connected to the line to which the second driving voltage Vss is supplied. The light emitting layer EL may be disposed between the first electrode layer E1 and the second electrode layer E2. Depending on the type of the light emitting element ED, the light emitting layer EL may include an organic material or an inorganic material.

The light emitting element ED may represent brightness according to a driving current supplied through the driving transistor DRT.

In this way, as the light emitting element ED represents brightness corresponding to image data according to driving of the circuit elements included in each subpixel SP, the subpixel SP may display an image.

The circuit elements such as thin film transistors and the light emitting element ED included in the subpixel SP may be disposed on a substrate, and thereby, may constitute the subpixel SP which is arranged in the display panel 110.

The above-described circuit elements may also be disposed on a substrate which is implemented to be easily deformable.

Figure 3:
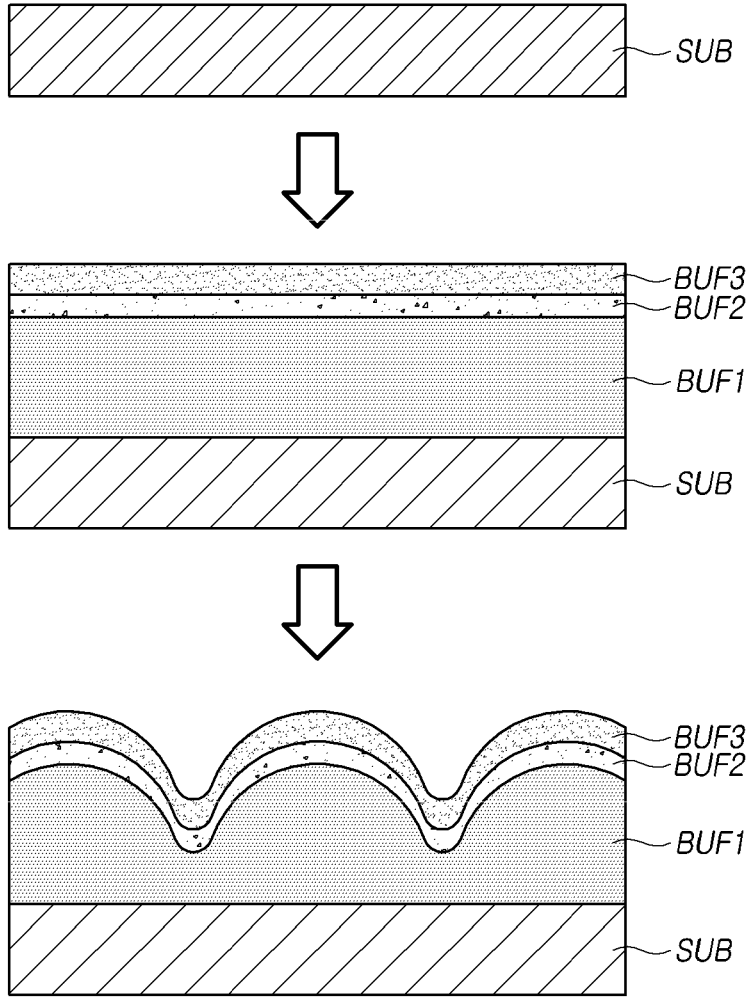
FIG. 3 is a diagram illustrating an example of a method of fabricating an array substrate on which thin film transistors included in a display device in accordance with embodiments of the present disclosure are disposed.
Figure 4:
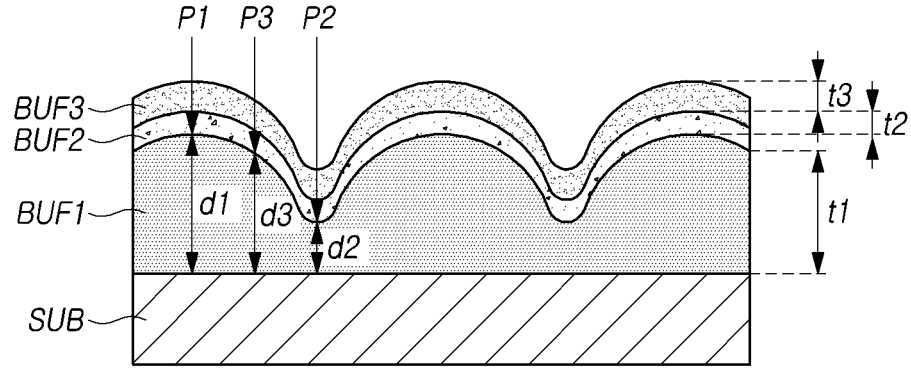
FIG. 4 is a diagram illustrating an example of the structure of an array substrate on which thin film transistors included in a display device in accordance with embodiments of the present disclosure are disposed.
Figure 5:
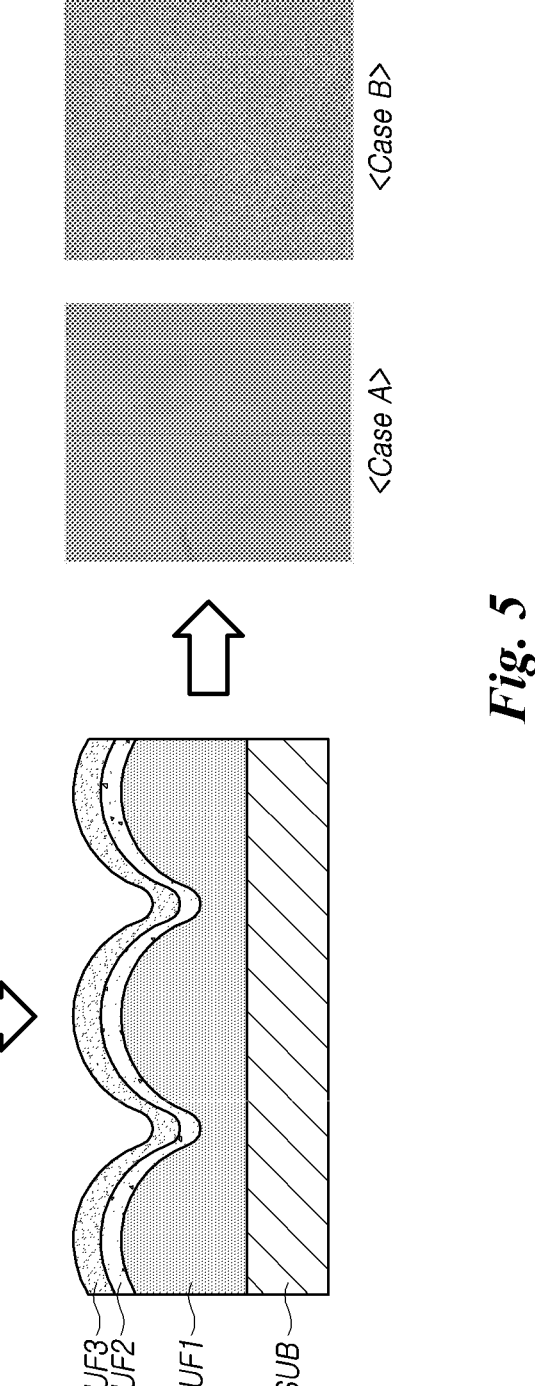
FIG. 5 is a diagram showing examples of optical images of the top surface of an array substrate on which thin film transistors included in a display device in accordance with embodiments of the present disclosure are disposed.

FIG. 3 is a diagram illustrating an example of a method of fabricating an array substrate on which thin film transistors (TFT) included in a display device 100 in accordance with embodiments of the present disclosure are disposed. FIG. 4 is a diagram illustrating an example of the structure of an array substrate on which thin film transistors (TFT) included in a display device 100 in accordance with embodiments of the present disclosure are disposed. FIG. 5 is a diagram showing examples of optical images of the top surface of an array substrate on which thin film transistors (TFT) included in a display device 100 in accordance with embodiments of the present disclosure are disposed.

Referring to FIG. 3, at least one buffer layer may be disposed on a substrate SUB.

In the present specification, the substrate SUB and the at least one buffer layer disposed on the substrate SUB may be collectively referred to as an "array substrate." In addition, the array substrate and thin film transistors (TFT) disposed on the array substrate may be collectively referred to as a "thin film transistor array substrate."

For example, the substrate SUB may be made of a material which is deformable in its shape, such as a flexible or stretchable material.

The substrate SUB may be made of, for example, polyimide, but embodiments of the present disclosure are not limited thereto.

Circuit elements such as thin film transistors (TFT) or light emitting elements ED may be disposed on the substrate SUB, and thereby, the display panel 110 may be implemented. Before the circuit elements are disposed on the substrate SUB, at least one buffer layer may be disposed.

For example, a first buffer layer BUF1 may be disposed on the substrate SUB.

The first buffer layer BUF1 may be made of, for example, an organic material. The first buffer layer BUF1 may be made of, for example, polystyrene, but embodiments of the present disclosure are not limited thereto.

The first buffer layer BUF1 made of an organic material may be disposed with a certain thickness.

A second buffer layer BUF2 may be disposed on the first buffer layer BUF1.

The second buffer layer BUF2 may include, for example, a metal or a metal oxide. The second buffer layer BUF2 may be made of, for example, a metal such as titanium (Ti), aluminum (Al), gold (Au), silver (Ag) and platinum (Pt) or a metal oxide such as titanium oxide (TiO) and zinc oxide (ZnO), but embodiments of the present disclosure are not limited thereto.

The thickness of the second buffer layer BUF2 may be smaller than the thickness of the first buffer layer BUF1.

The second buffer layer BUF2 may be disposed between the first buffer layer BUF1 and a third buffer layer BUF3, and may provide the function of an adhesive layer.

The third buffer layer BUF3 may be disposed on the second buffer layer BUF2.

The third buffer layer BUF3 may be made of, for example, an inorganic material. The third buffer layer BUF3 may be made of, for example, aluminum oxide ($Al_2O_3$), but embodiments of the present disclosure are not limited thereto.

The third buffer layer BUF3 may be disposed to be thicker than the second buffer layer BUF2. The thickness of the third buffer layer BUF3 may be smaller than the thickness of the first buffer layer BUF1.

Thin film transistors (TFT) may be disposed on the third buffer layer BUF3.

Before or after the thin film transistors (TFT) are disposed on the third buffer layer BUF3, heat treatment may be performed to allow the buffer layer on the substrate SUB to form a wavy structure.

The first buffer layer BUF1, the second buffer layer BUF2 and the third buffer layer BUF3 are disposed on the substrate SUB, and before or after the thin film transistors (TFT) are disposed, heat treatment may be performed.

When the heat treatment is performed, the shape of the first buffer layer BUF1 which is disposed to be relatively thick and includes an organic material with a large thermal expansion coefficient may be changed. The top surface of the first buffer layer BUF1 may have a curved shape.

The bottom surface of the first buffer layer BUF1 may maintain a flat shape.

Alternatively, as the case may be, the bottom surface of the first buffer layer BUF1 may also have a curved shape. In this case, the degree of curvature of the bottom surface of the first buffer layer BUF1 may be smaller than the degree of curvature of the top surface of the first buffer layer BUF1.

Since the second buffer layer BUF2 disposed on the first buffer layer BUF1 is made of a metal or a metal oxide, the second buffer layer BUF2 may maintain a constant thickness after the heat treatment, and may be disposed along the curved shape of the top surface of the first buffer layer BUF1.

The thermal expansion coefficient of the third buffer layer BUF3 disposed on the second buffer layer BUF2 may be smaller than the thermal expansion coefficient of the first buffer layer BUF1. The third buffer layer BUF3 is disposed on the second buffer layer BUF2, and may be disposed along the curved shape of the top surface of the first buffer layer BUF1.

In this way, by the heat treatment, the wavy structure in which the first buffer layer BUF1 has a different thickness depending on a position and the second buffer layer BUF2 and the third buffer layer BUF3 have uniform thicknesses may be implemented.

Referring to FIG. 4, before the heat treatment is performed, the thicknesses of the first buffer layer BUF1, the second buffer layer BUF2 and the third buffer layer BUF3 disposed on the substrate SUB may be a first thickness t1, a second thickness t2 and a third thickness t3, respectively.

For example, the first thickness t1 may be larger than the second thickness t2 and the third thickness t3. The second thickness t2 may be smaller than the first thickness t1 and the third thickness t3. The third thickness t3 may be smaller than the first thickness t1 and larger than the second thickness t2.

When the heat treatment is performed, the shape of the first buffer layer BUF1 may be changed.

The vertical distance between a first point P1 on the top surface of the first buffer layer BUF1 and the substrate SUB may be a first distance d1. The vertical distance between a second point P2 on the top surface of the first buffer layer BUF1 and the substrate SUB may be a second distance d2. The vertical distance between a third point P3 on the top surface of the first buffer layer BUF1 and the substrate SUB may be a third distance d3.

The first distance d1 may be larger than the second distance d2 and the third distance d3. The second distance d2 may be smaller than the first distance d1 and the third distance d3.

Since the thickness of the first buffer layer BUF1 or the vertical distance between the top surface of the first buffer layer BUF1 and the substrate SUB becomes different depending on a position due to the heat treatment, the top surface of the first buffer layer BUF1 may have a curved shape, and the wavy structure may be implemented.

The second buffer layer BUF2 may be disposed along the curved top surface of the first buffer layer BUF1, and may form a curved shape. The third buffer layer BUF3 may be disposed along the curved top surface of the second buffer layer BUF2, and may form a curved shape.

The thickness of the second buffer layer BUF2 on the first point P1 may be the same as or similar to the thickness of the second buffer layer BUF2 on the second point P2. The thickness of the third buffer layer BUF3 on the first point P1 may be the same as or similar to the thickness of the third buffer layer BUF3 on the second point P2.

Since the second buffer layer BUF2 and the third buffer layer BUF3 are disposed with constant thicknesses on the first buffer layer BUF1 whose thickness is different depending on a position, the wavy structure in which the top surface of the buffer layer is curved may be implemented.

Since the wavy structure is implemented as the second buffer layer BUF2 and the third buffer layer BUF3 are disposed along the curved shape of the top surface of the first buffer layer BUF1, an array substrate having stretchable characteristics may be implemented. The display device 100 having foldable, rollable or stretchable characteristics may be implemented on the basis of such an array substrate.

Since the second buffer layer BUF2 is entirely disposed between the first buffer layer BUF1 and the third buffer layer BUF3, it is possible to prevent a crack from occurring in the third buffer layer BUF3 in the process in which the shape of the buffer layer is changed by the heat treatment.

Referring to FIG. 5, the first buffer layer BUF1, the second buffer layer BUF2 and the third buffer layer BUF3 may be disposed on the substrate SUB, and the wavy structure may be implemented by the heat treatment.

In the process in which the wavy structure is implemented, a crack may occur in the third buffer layer BUF3 due to a difference between the thermal expansion coefficient of the first buffer layer BUF1 made of an organic material and the thermal expansion coefficient of the third buffer layer BUF3 made of an inorganic material. However, since the second buffer layer BUF2 is entirely disposed between the first buffer layer BUF1 and the third buffer layer BUF3, it is possible to prevent a crack from occurring in the third buffer layer BUF3.

For example, <Case A> shows the optical image of the top surface of the third buffer layer BUF3 when the heat treatment is performed at a first temperature, and <Case B> shows the optical image of the top surface of the third buffer layer BUF3 when the heat treatment is performed at a second temperature higher than the first temperature.

It may be checked that a crack does not occur on the top surface of the third buffer layer BUF3 even when the heat treatment is performed at a high temperature.

The wavy structure based on the stack structure of the first buffer layer BUF1 and the third buffer layer BUF3 with different thermal expansion coefficients may be implemented.

That is to say, the second buffer layer BUF2 may provide the function of an adhesive layer between the first buffer layer BUF1 and the third buffer layer BUF3, and may also provide the function of preventing a crack from occurring in the third buffer layer BUF3 during the heat treatment process.

In addition, as the second buffer layer BUF2 is disposed using a metal oxide, the array substrate in which the wavy structure is implemented may be provided while not affecting the characteristics of the thin film transistors (TFT) disposed on the third buffer layer BUF3.

Figure 6:
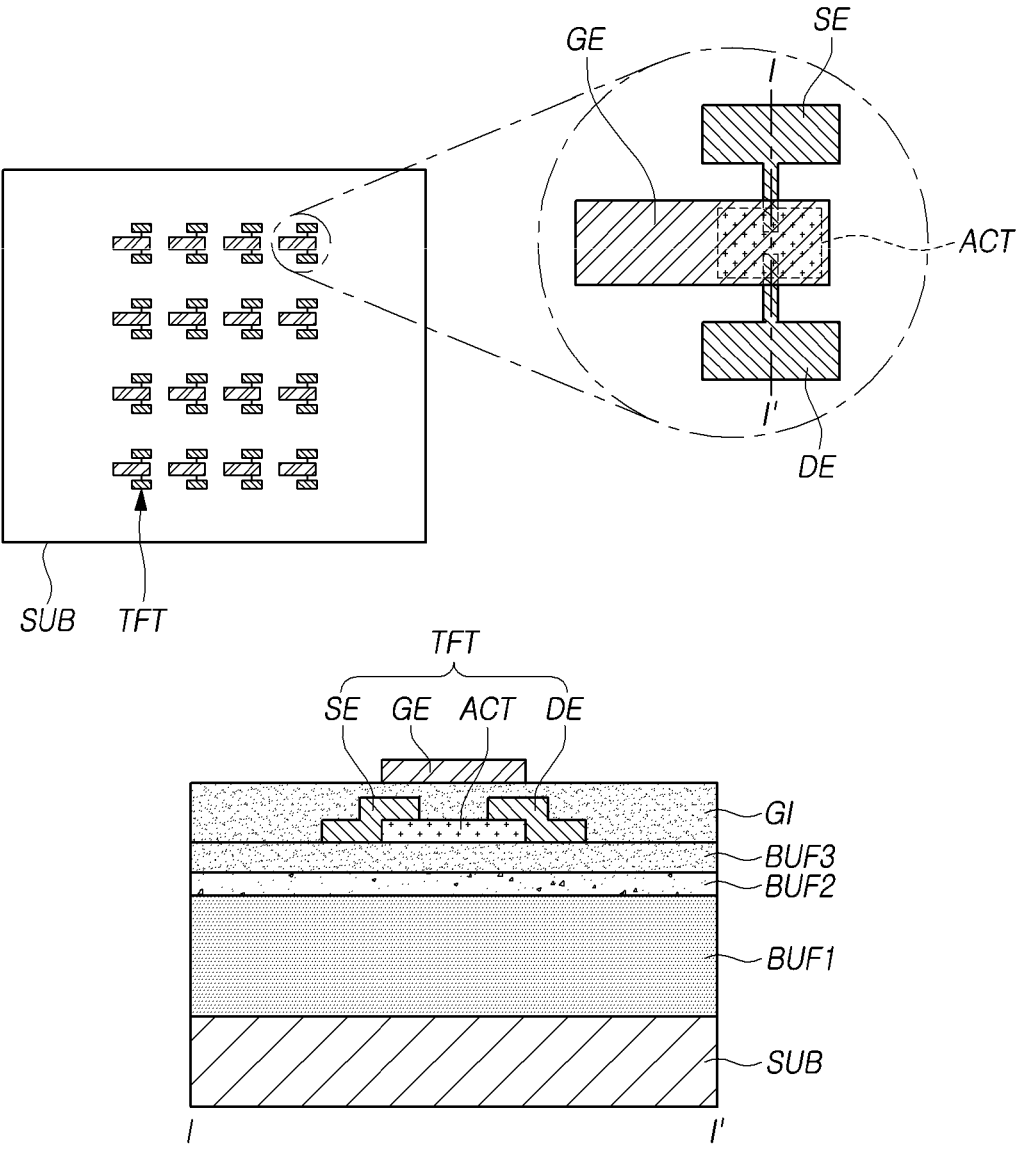
FIGS. 6 and 7 are diagrams illustrating examples of structures in which thin film transistors are disposed on an array substrate included in a display device in accordance with embodiments of the present disclosure.
Figure 7:
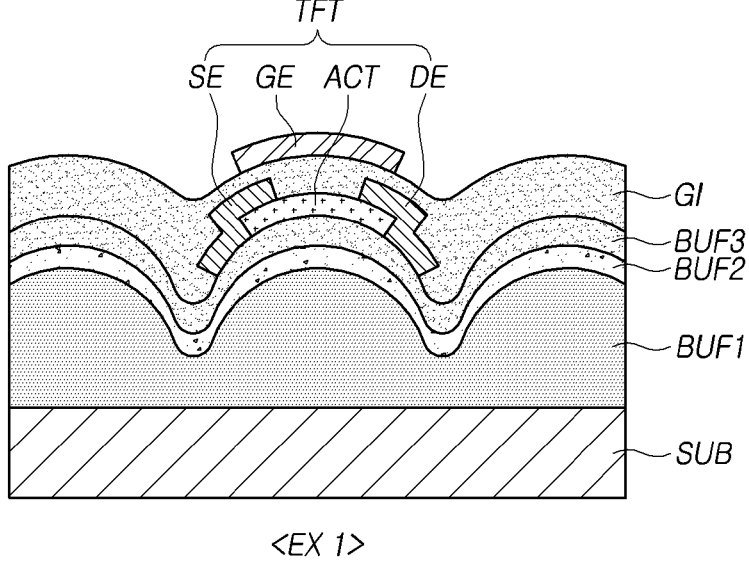
Figure 7:
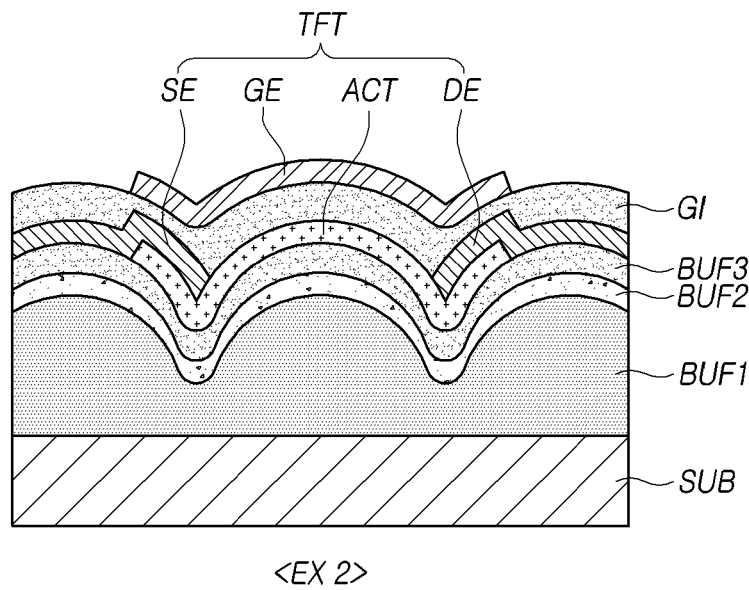
Figure 8:
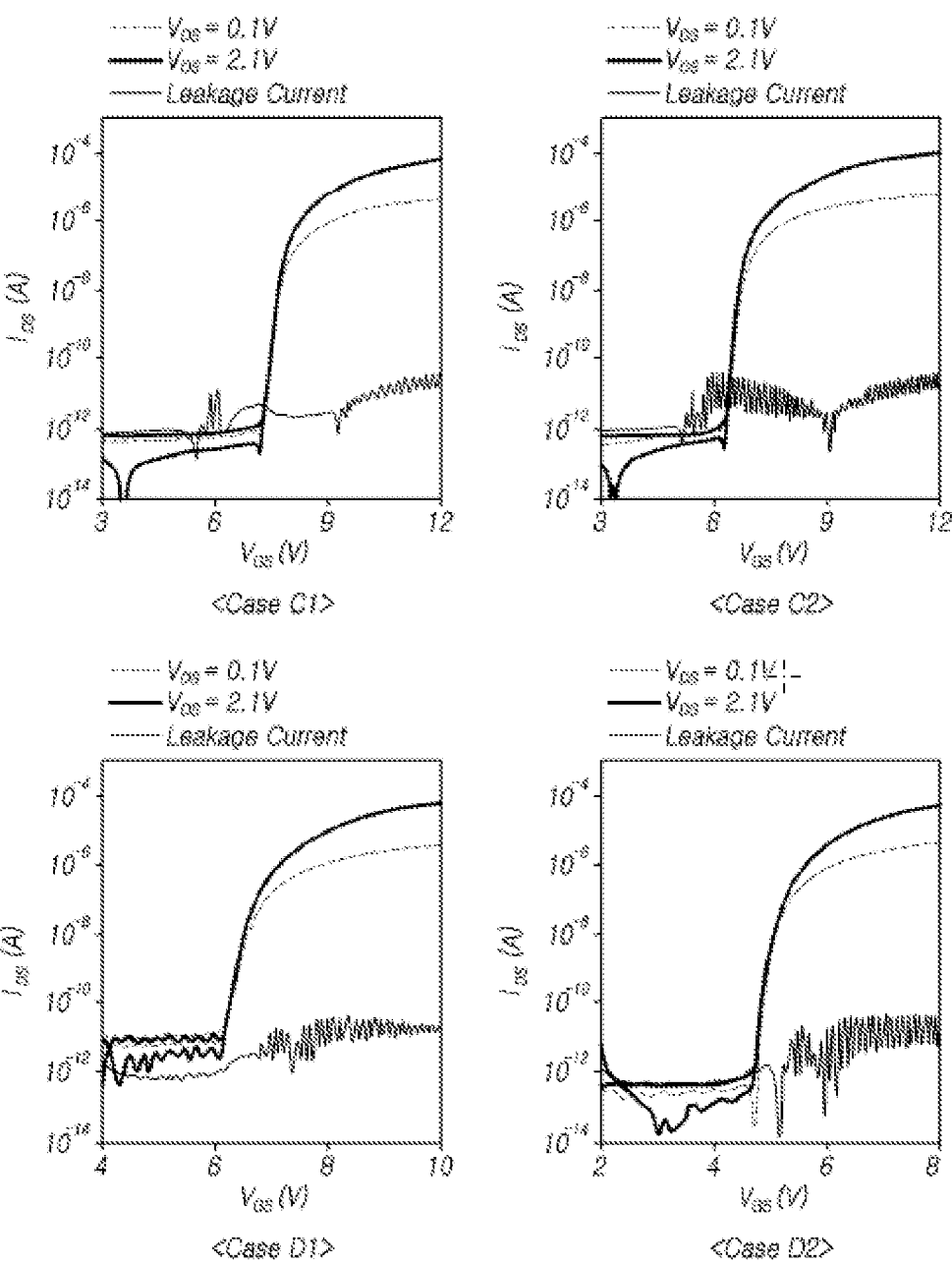
FIG. 8 is a diagram showing examples of driving characteristics of thin film transistors disposed on an array substrate included in a display device in accordance with embodiments of the present disclosure.

FIGS. 6 and 7 are diagrams illustrating examples of structures in which thin film transistors TFT are disposed on an array substrate included in a display device 100 in accordance with embodiments of the present disclosure. FIG. 8 is a diagram showing examples of driving characteristics of thin film transistors TFT disposed on an array substrate included in a display device 100 in accordance with embodiments of the present disclosure.

FIGS. 6 to 8 exemplarily show structures arbitrarily implemented to measure characteristics of thin film transistors TFT disposed on an array substrate in which a wavy structure is implemented. The structure of the thin film transistor TFT disposed on the array substrate which forms the wavy structure may be various.

FIG. 6 illustrates, as an example, the planar structure and the cross-sectional structure of a portion I-I' of the thin film transistor TFT disposed on a substrate SUB.

Referring to FIG. 6, a first buffer layer BUF1, a second buffer layer BUF2 and a third buffer layer BUF3 may be disposed on the substrate SUB.

Since the materials and structures of the first buffer layer BUF1, the second buffer layer BUF2 and the third buffer layer BUF3 may be the same as or similar to those of the aforementioned examples, repeated descriptions will be omitted.

The thin film transistor TFT may be disposed on the third buffer layer BUF3.

The thin film transistor TFT may include a semiconductor layer ACT, a source electrode SE, a drain electrode DE and a gate electrode GE.

The semiconductor layer ACT, the source electrode SE and the drain electrode DE may be disposed on the third buffer layer BUF3.

A gate insulating layer GI may be disposed on the semiconductor layer ACT, the source electrode SE and the drain electrode DE. The gate electrode GE may be disposed on the gate insulating layer GI.

The semiconductor layer ACT may be disposed on the third buffer layer BUF3.

The semiconductor layer ACT may be positioned in an area overlapping the second buffer layer BUF2. The semiconductor layer ACT may be positioned to be spaced apart from the second buffer layer BUF2 by the third buffer layer BUF3.

Before or after the thin film transistor TFT is disposed on the third buffer layer BUF3, heat treatment for forming the wavy structure may be performed.

The thin film transistor TFT may be disposed along the shape of the wavy structure.

A portion of at least one of the semiconductor layer ACT, the source electrode SE, the drain electrode DE and the gate electrode GE of the thin film transistor TFT may be disposed in a curved shape along the curved shape of the top surface of the third buffer layer BUF3.

For example, as illustrated in FIG. 7, the thin film transistor TFT may be disposed along the curved shape of the top surface of the third buffer layer BUF3.

As illustrated in <EX 1>, according to the wavy shape of the first buffer layer BUF1, the second buffer layer BUF2 and the third buffer layer BUF3, the thin film transistor TFT may be disposed to be positioned in the convex or concave portion of a buffer layer.

Alternatively, as illustrated in <EX2>, the thin film transistor TFT may be disposed to be positioned in an area overlapping two or more convex or concave portions of a buffer layer.

Even though the semiconductor layer ACT, the source electrode SE, the drain electrode DE and the gate electrode GE of the thin film transistor TFT are disposed in the curved shape along a wavy shape by the buffer layer, since the distance between the gate electrode GE and the semiconductor layer ACT is kept constant by the gate insulating layer GI, characteristics of the thin film transistor TFT may be stably maintained.

At least one interlayer insulating layer may be further disposed on the thin film transistor TFT. Light emitting elements ED or the likes may be further disposed on the at least one interlayer insulating layer.

The bottom surface of the at least one interlayer insulating layer may have a curved shape. As the case may be, the top surface of the at least one interlayer insulating layer may also have a curved shape.

The semiconductor layer ACT of the thin film transistor TFT may be positioned by being spaced apart from the second buffer layer BUF2 by the thickness of the third buffer layer BUF3.

Since the second buffer layer BUF2 is made of a metal oxide, the second buffer layer BUF2 may not affect the semiconductor layer ACT positioned over the second buffer layer BUF2.

Referring to FIG. 8, an example in which a current $I_{DS}$ flowing according to a voltage $V_{GS}$ between the gate and source of the thin film transistor TFT and a leakage current are measured is shown.

<Case C1> and <Case C2> show examples in which characteristics of the thin film transistor TFT when the buffer layer on the substrate SUB does not form the wavy structure are measured. <Case D1> and <Case D2> show examples in which characteristics of the thin film transistor TFT when the buffer layer on the substrate SUB forms the wavy structure are measured.

<Case C1> and <Case D1> represent characteristics of the thin film transistor TFT when the heat treatment is performed at a first temperature. <Case C2> and <Case D2> represent characteristics of the thin film transistor TFT when the heat treatment is performed at a second temperature higher than the first temperature.

It may be checked that, even when the wavy structure by the first buffer layer BUF1, the second buffer layer BUF2 and the third buffer layer BUF3 is formed, the current output characteristics of the thin film transistor TFT appear similar to a case where a wavy structure is not formed.

In this way, the display device 100, which has stretchable characteristics and is capable of being changed to various shapes by the array substrate formed with the wavy structure by the first buffer layer BUF1, the second buffer layer BUF2 and the third buffer layer BUF3, may be implemented.

Since the second buffer layer BUF2 made of a metal or a metal oxide is disposed between the first buffer layer BUF1 made of an organic material and the third buffer layer BUF3 made of an inorganic material, it is possible to provide the function of an adhesive layer and prevent a crack from occurring in the third buffer layer BUF3 in heat treatment.

In addition, the second buffer layer BUF2 may be made of a metal oxide. As the second buffer layer BUF2 is made of a metal oxide, the second buffer layer BUF2 may not affect the semiconductor layer ACT of the thin film transistor TFT disposed on the third buffer layer BUF3. Thus, the array substrate which is formed with the wavy structure while maintaining driving characteristics of the thin film transistor TFT may be provided.

A brief description of the embodiments of the present disclosure described above is as follows.

The display device 100 according to the embodiments of the present disclosure may include the substrate SUB, the first buffer layer BUF1 which is disposed on the substrate SUB and has the vertical distance between the first point P1 on the top surface thereof and the substrate SUB being the first distance d1 and the vertical distance between the second point P2 on the top surface thereof and the substrate SUB being the second distance d2 smaller than the first distance d1, the second buffer layer BUF2 which is disposed on the first buffer layer BUF1 and includes a metal oxide, the third buffer layer BUF3 which is disposed on the second buffer layer BUF2, and the plurality of thin film transistors TFT which are disposed on the third buffer layer BUF3.

The second buffer layer BUF2 may be disposed along the shape of the top surface of the first buffer layer BUF1.

The top surface of the second buffer layer BUF2 may have a curved shape.

The thickness of the second buffer layer BUF2 positioned on the first point P1 may be the same as the thickness of the second buffer layer BUF2 positioned on the second point P2.

The thickness of the second buffer layer BUF2 may be smaller than the second distance d2.

The first buffer layer BUF1 may include an organic material.

The top surface of the first buffer layer BUF1 may have a curved shape.

The bottom surface of the first buffer layer BUF1 may have a flat shape.

The third buffer layer BUF3 may include an inorganic material.

The third buffer layer BUF3 may be disposed along the shape of the top surface of the second buffer layer BUF2.

The thickness of the third buffer layer BUF3 may be larger than the thickness of the second buffer layer BUF2.

The thickness of the third buffer layer BUF3 may be constant.

Each of the plurality of thin film transistors TFT may include the semiconductor layer ACT. At least a portion of the semiconductor layer ACT may have a curved shape along the shape of the top surface of the third buffer layer BUF3.

The semiconductor layer ACT may be positioned in an area overlapping the second buffer layer BUF2. The distance between the semiconductor layer ACT and the second buffer layer BUF2 may be the same as the thickness of the third buffer layer BUF3.

The display device 100 may further include at least one interlayer insulating layer which is disposed on the plurality of thin film transistors TFT and whose top surface has a curved shape.

The display device 100 according to the embodiments of the present disclosure may include the substrate SUB, the first buffer layer BUF1 which is disposed on the substrate SUB and has a flat bottom surface and a curved top surface, the second buffer layer BUF2 which is disposed on the first buffer layer BUF1, is disposed along the shape of the top surface of the first buffer layer BUF1 and includes a metal oxide, the third buffer layer BUF3 which is disposed on the second buffer layer BUF2 and is disposed along the shape of the top surface of the second buffer layer BUF2, and the plurality of thin film transistors TFT each of which is disposed on the third buffer layer BUF3 and includes the semiconductor layer ACT, the gate electrode GE, the source electrode SE and the drain electrode DE and in each of which at least one of the semiconductor layer ACT, the gate electrode GE, the source electrode SE and the drain electrode DE is curved along the shape of the top surface of the third buffer layer BUF3.

The third buffer layer BUF3 may be thinner than the first buffer layer BUF1 and thicker than the second buffer layer BUF2.

The thickness of each of the second buffer layer BUF2 and the third buffer layer BUF3 may be constant.

The thin film transistor array substrate according to the embodiments of the present disclosure may include the substrate SUB, the first buffer layer BUF1 which is disposed on the substrate SUB and has the vertical distance between the first point P1 on the top surface thereof and the substrate SUB being the first distance d1 and the vertical distance between the second point P2 on the top surface thereof and the substrate SUB being the second distance d2 smaller than the first distance d1, the second buffer layer BUF2 which is disposed on the first buffer layer BUF1 and includes a metal oxide, the third buffer layer BUF3 which is disposed on the second buffer layer BUF2 and is thicker than the second buffer layer BUF2, and the plurality of thin film transistors TFT which are disposed on the third buffer layer BUF3.

The above description has been presented to enable any person skilled in the art to make and use the technical idea of the present disclosure, and has been provided in the context of a particular application and its features and benefits. Various modifications, additions and substitutions to the described embodiments will be readily apparent to those skilled in the art, and the general principles described herein may be applied to other embodiments and applications without departing from the spirit and scope of the present disclosure. The above description and the accompanying drawings provide an example of the technical idea of the present disclosure for illustrative purposes only. Thus, the scope of the present claims and the disclosure are not limited just to the embodiments shown, but is to be accorded the widest scope consistent with the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a substrate;
   a first buffer layer disposed on the substrate, and having a vertical distance between a first point on a top surface thereof and the substrate being a first distance and a vertical distance between a second point on the top surface thereof and the substrate being a second distance smaller than the first distance;
   a second buffer layer disposed on the first buffer layer, and including a metal oxide;
   a third buffer layer disposed on the second buffer layer; and
   a plurality of thin film transistors disposed on the third buffer layer,
   wherein:
   the second buffer layer and the third buffer layer are separate layers comprising different materials from each other; and
   a top surface of the second buffer layer and a bottom surface of the third buffer layer comprise respective at least curved portions not being parallel to a top surface of the substrate.

2. The display device of claim 1, wherein the second buffer layer is disposed along a shape of the top surface of the first buffer layer.

3. The display device of claim 1, wherein the top surface of the second buffer layer has a curved shape.

4. The display device of claim 1, wherein a thickness of the second buffer layer positioned on the first point is the same as a thickness of the second buffer layer positioned on the second point.

5. The display device of claim 1, wherein a thickness of the second buffer layer is smaller than the second distance.

6. The display device of claim 1, wherein the first buffer layer includes an organic material.

7. The display device of claim 1, wherein the top surface of the first buffer layer has a curved shape.

8. The display device of claim 1, wherein a bottom surface of the first buffer layer has a flat shape.

9. The display device of claim 1, wherein the third buffer layer includes an inorganic material.

10. The display device of claim 1, wherein the third buffer layer is disposed along a shape of the top surface of the second buffer layer.

11. The display device of claim 1, wherein a thickness of the third buffer layer is larger than a thickness of the second buffer layer.

12. The display device of claim 1, wherein a thickness of the third buffer layer is constant.

13. The display device of claim 1, wherein each of the plurality of thin film transistors includes a semiconductor layer, and at least a portion of the semiconductor layer has a curved shape along a shape of a top surface of the third buffer layer.

14. The display device of claim 13, wherein the semiconductor layer is positioned in an area which overlaps the second buffer layer, and a distance between the semiconductor layer and the second buffer layer is the same as a thickness of the third buffer layer.

15. The display device of claim 1, further comprising:
   at least one interlayer insulating layer disposed on the plurality of thin film transistors, and having a top surface which has a curved shape.

16. A display device comprising:
   a substrate;
   a first buffer layer disposed on the substrate, and having a flat bottom surface and a curved top surface;
   a second buffer layer disposed on the first buffer layer, disposed along a shape of the top surface of the first buffer layer, and including a metal oxide;
   a third buffer layer disposed on the second buffer layer, and disposed along a shape of a top surface of the second buffer layer; and
   a plurality of thin film transistors disposed on the third buffer layer, and each including a semiconductor layer, a gate electrode, a source electrode and a drain electrode, at least one of the semiconductor layer, the gate electrode, the source electrode and the drain electrode being curved along a shape of a top surface of the third buffer layer
   wherein:
   the second buffer layer and the third buffer layer are separate layers comprising different materials from each other; and
   the top surface of the second buffer layer and a bottom surface of the third buffer layer comprise respective at least curved portions not being parallel to a top surface of the substrate.

17. The display device of claim 16, wherein the third buffer layer is thinner than the first buffer layer and is thicker than the second buffer layer.

18. The display device of claim 16, wherein a thickness of the second buffer layer is constant and a thickness of the third buffer layer is constant.

19. A thin film transistor array substrate comprising:

a substrate;

a first buffer layer disposed on the substrate, and having a vertical distance between a first point on a top surface thereof and the substrate being a first distance and a vertical distance between a second point on the top surface thereof and the substrate being a second distance smaller than the first distance;

a second buffer layer disposed on the first buffer layer, and including a metal oxide;

a third buffer layer disposed on the second buffer layer, and thicker than the second buffer layer; and a plurality of thin film transistors disposed on the third buffer layer, wherein:

the second buffer layer and the third buffer layer are separate layers comprising different materials from each other; and a top surface of the second buffer layer and a bottom surface of the third buffer layer comprise respective at least curved portions not being parallel to a top surface of the substrate.

* * * * *